(12) United States Patent
Karakida et al.

(10) Patent No.: US 8,106,291 B2
(45) Date of Patent: Jan. 31, 2012

(54) SOLAR BATTERY AND MANUFACTURING METHOD THEREFOR

(75) Inventors: Shoichi Karakida, Tokyo (JP); Hiroaki Morikawa, Tokyo (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 734 days.

(21) Appl. No.: 11/578,063

(22) PCT Filed: May 7, 2004

(86) PCT No.: PCT/JP2004/006470
§ 371 (c)(1),
(2), (4) Date: Oct. 12, 2006

(87) PCT Pub. No.: WO2005/109524
PCT Pub. Date: Nov. 17, 2005

(65) Prior Publication Data
US 2007/0209697 A1 Sep. 13, 2007

(51) Int. Cl.
*H01L 31/0224* (2006.01)
(52) U.S. Cl. .................................................. 136/256
(58) Field of Classification Search .......... 136/243–265
See application file for complete search history.

(56) References Cited

FOREIGN PATENT DOCUMENTS

| JP | 06053531 A | * | 2/1994 |
|----|------------|---|--------|
| JP | 11-103084 A | | 4/1999 |
| JP | 2000-294819 A | | 10/2000 |
| JP | 2000-340812 A | | 12/2000 |
| JP | 2001-044459 A | | 2/2001 |
| JP | 2002-353477 A | | 12/2002 |
| JP | 2003-309274 A | | 10/2003 |
| JP | 2003-338631 A | | 11/2003 |
| JP | 2004-014566 A | | 1/2004 |

OTHER PUBLICATIONS

JPO machine translation of JP 2004014566 A, Jan. 15, 2004.*
JPO machine translation of JP 06053531 A, Feb. 25, 1994.*

* cited by examiner

*Primary Examiner* — Jessica L Ward
*Assistant Examiner* — Kevin E Yoon
(74) *Attorney, Agent, or Firm* — Buchanan Ingersoll & Rooney PC

(57) ABSTRACT

When forming an electrode by printing several times, the cross section area of the electrode is increased and the resistance is reduced while more electrode material is required, which leads to a cost up and waste of resources. There is provided a solar cell manufacturing method for forming an electrode of a predetermined pattern by repeating printing on a substrate surface by a predetermined number of times. A mask pattern for printing the entire predetermined pattern is used at least once among the predetermined number of printings while mask patterns, each for printing a part of the predetermined pattern, are used in the other printings, thereby forming the electrode of the predetermined pattern.

2 Claims, 9 Drawing Sheets

FIG. 4
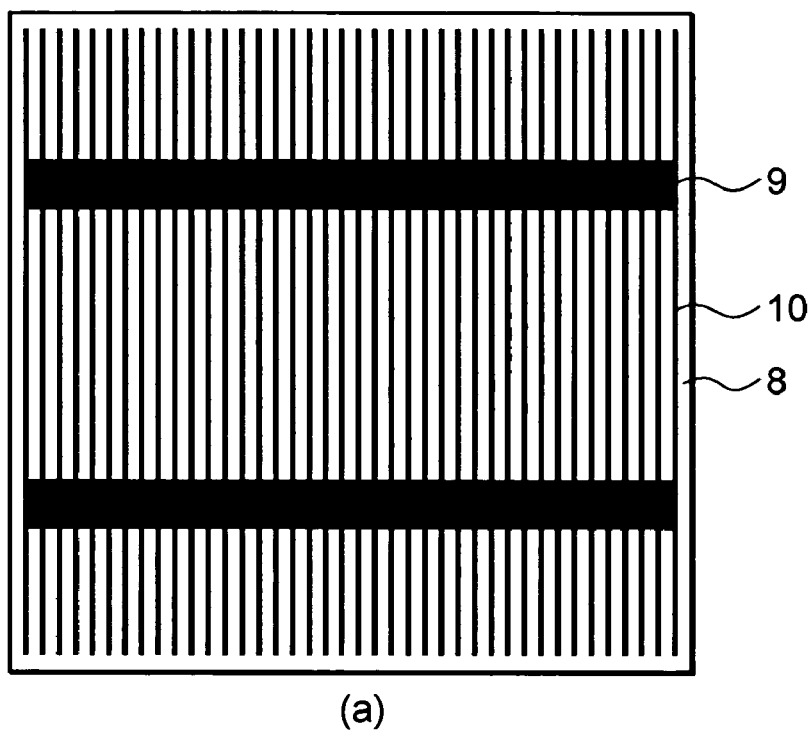
(a)
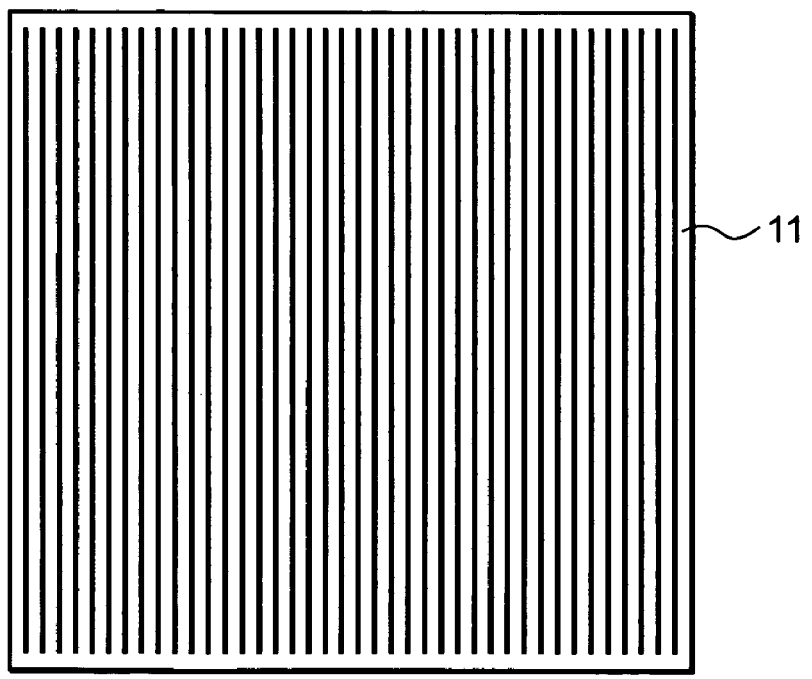
(b)

FIG. 5
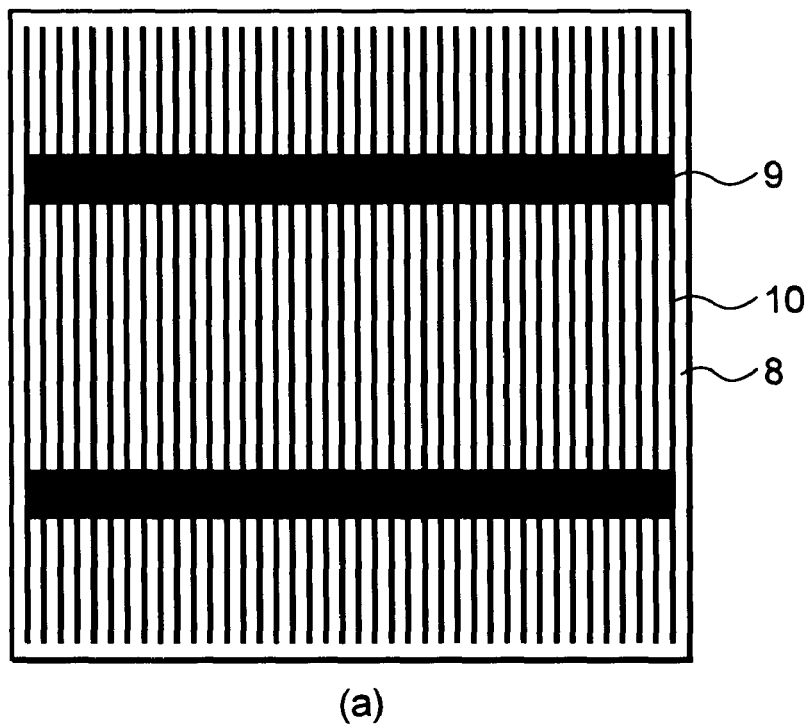
(a)
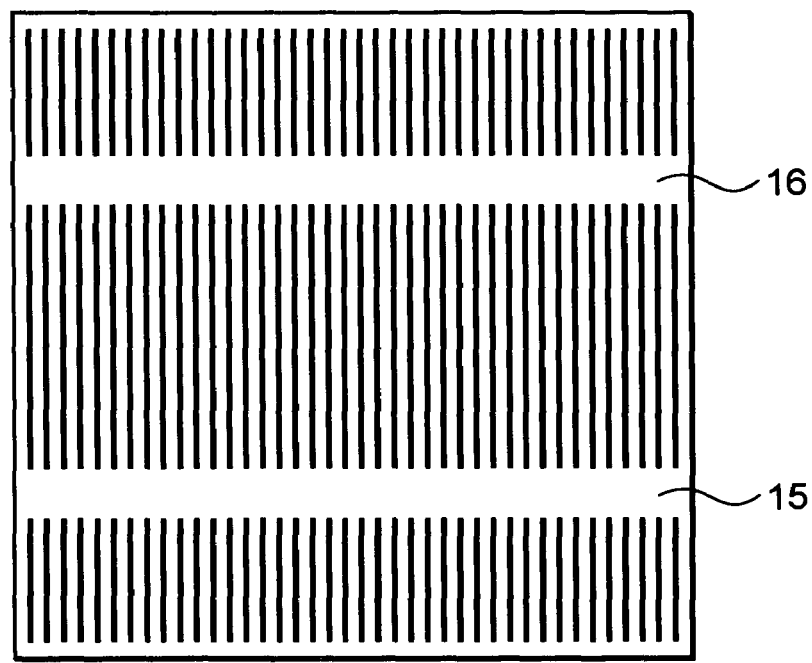
(b)

FIG. 6
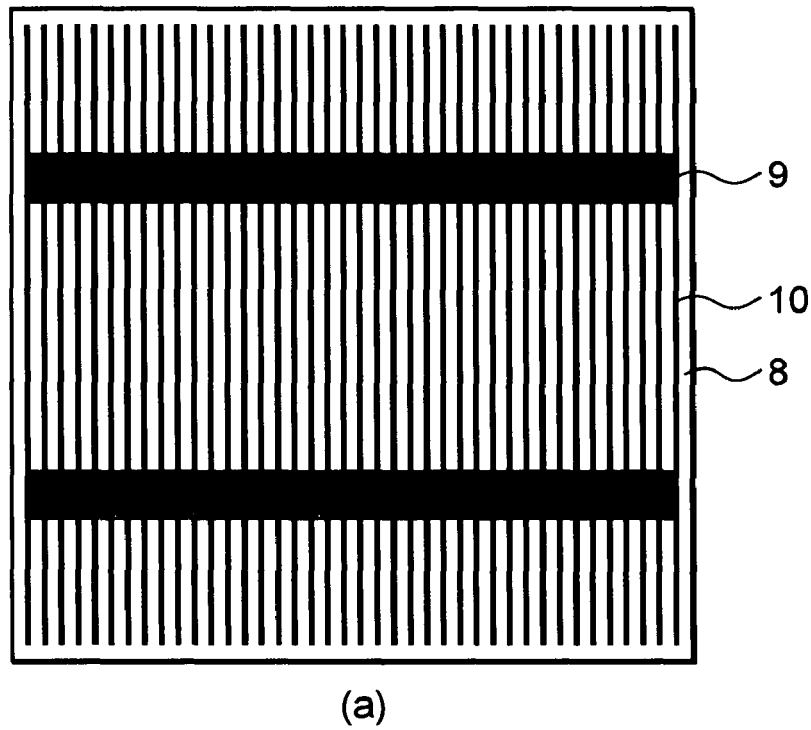
(a)
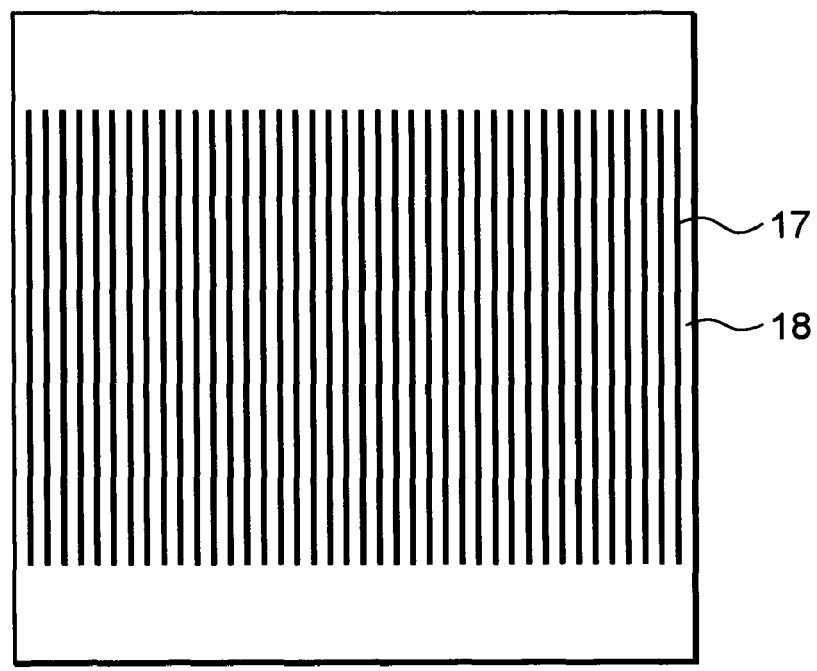
(b)

FIG. 7
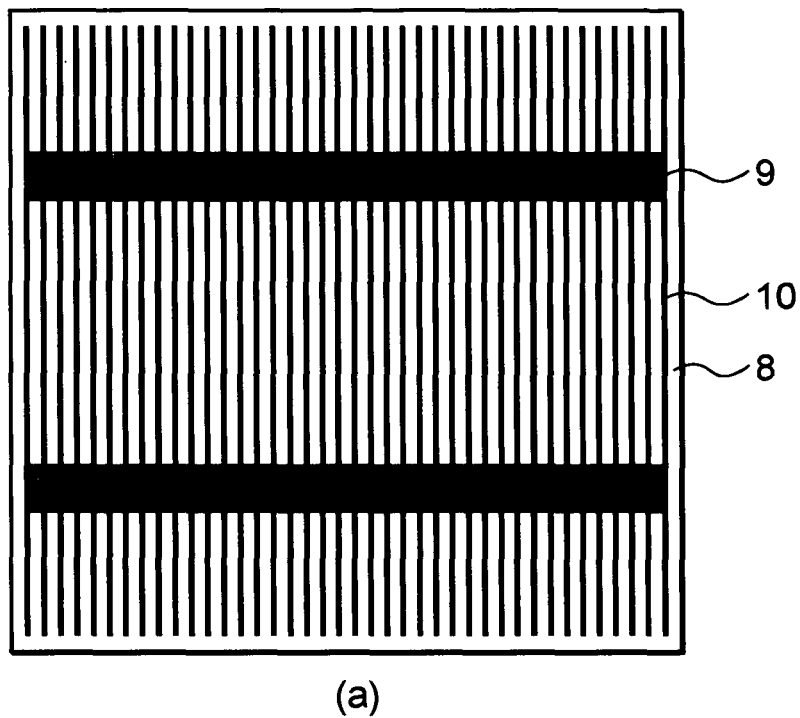
(a)
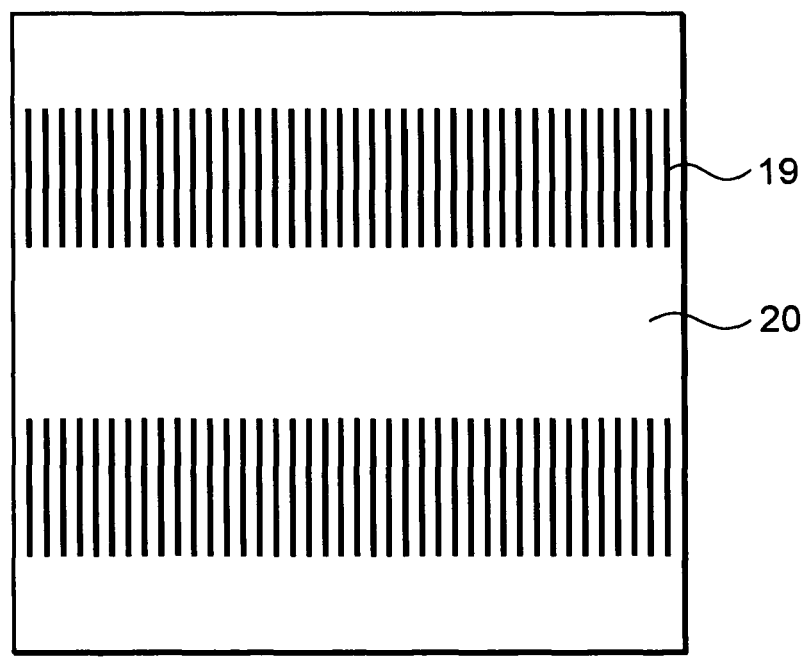
(b)

FIG. 8
CROSS-SECTIONAL VIEW ALONG LINE B-B'
CROSS-SECTIONAL VIEW ALONG LINE C-C'
(a)
CROSS-SECTIONAL VIEW ALONG LINE B-B'
CROSS-SECTIONAL VIEW ALONG LINE C-C'
(b)
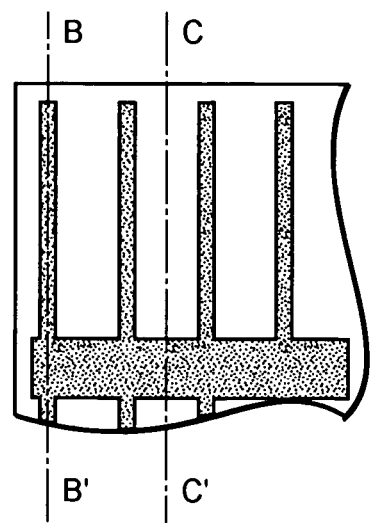

US 8,106,291 B2

SOLAR BATTERY AND MANUFACTURING METHOD THEREFOR

TECHNICAL FIELD

The present invention relates to solar batteries.

BACKGROUND ART

In a step of forming electrodes of solar batteries, a technology is well-known in which the surface roughness of the electrodes is reduced by screen-printing electrically conductive paste onto the electrodes a plurality of cycles, so as to decrease the resistance of the electrodes (referred to as Patent Document 1).

[Patent Document 1]
Japanese Laid-Open Patent Publication No. 103,084/1999.

In the electrode-forming technique described above, an underlying idea is that, by printing a plurality of cycles, the cross-sectional area of the electrodes increases and the resistance decreases accordingly; however, on the other hand, the amount of material consumed for the printing increases, which has led to cost rise and wasting resources.

Moreover, because grid electrodes provided on the side of light receiving faces are formed for the purpose of only collecting electrons, the electrodes do not contribute to electric power generation at all; therefore, by reducing these portions, efficiency in the electric power generation can be contrarily improved; however, if it is intended to narrow the grid width, it will then lead the electrode resistance to increase. For example, in order to make the electrode resistance to be equivalent before and after narrowing the grid width, when the width is halved, the thickness needs to be doubled. Accordingly, a problem has occurred in that consumption of the electrode material further increases.

An objective of the present invention, which is made to solve a problem as described above, is to obtain electrodes in which the consumption of row material is reduced while maintaining sufficient electrode performance.

DISCLOSURE OF THE INVENTION

A solar battery according to a first aspect of the present invention includes: a grid electrode formed on the front face of a substrate; and a bus electrode formed on the front face of the substrate and connected to the grid electrode, the thickness of the bus electrode is thinner than that of the grid electrode.

A solar battery according to a second aspect of the present invention includes: a bus electrode formed on the front face of a substrate; and a grid electrode, formed on the front face of the substrate, in which the grid electrode is thinner along an end portion thereof than along a portion thereof connected to the bus electrode.

A method of manufacturing a solar battery according to a third aspect of the present invention performs, to form electrodes having a predetermined pattern, a predetermined number of cycles of printings in which a mask pattern is used for printing the entire predetermined pattern at least once among the predetermined number of cycles, and the other mask patterns for printing part of the predetermined pattern the remaining number of cycles.

A method of manufacturing a solar battery according to a forth aspect of the present invention performs, to form electrodes having a predetermined pattern, a predetermined number of cycles of printings in which a mask pattern for printing part of the predetermined pattern is used every cycle the printing is performed among the predetermined number of cycles.

Thereby, a solar battery according to the present invention can be provided with sufficient performance as electrodes, while maintaining electrode material consumption under control.

BRIEF DESCRIPTION OF DRAWINGS

FIG. 4 is front views illustrating mask patterns according to Embodiment 1 of the present invention;

FIG. 5 is front views illustrating other mask patterns according to Embodiment 1 of the present invention;

FIG. 6 is front views illustrating mask patterns according to Embodiment 2 of the present invention;

FIG. 7 is front views illustrating other mask patterns according to Embodiment 2 of the present invention;

FIG. 8 is cross-sectional views of a substrate on which the electrodes are printed according to Embodiments 1 and 2 of the present invention.

BEST MODE FOR CARRYING OUT THE INVENTION

Embodiment 1

Figure 1:
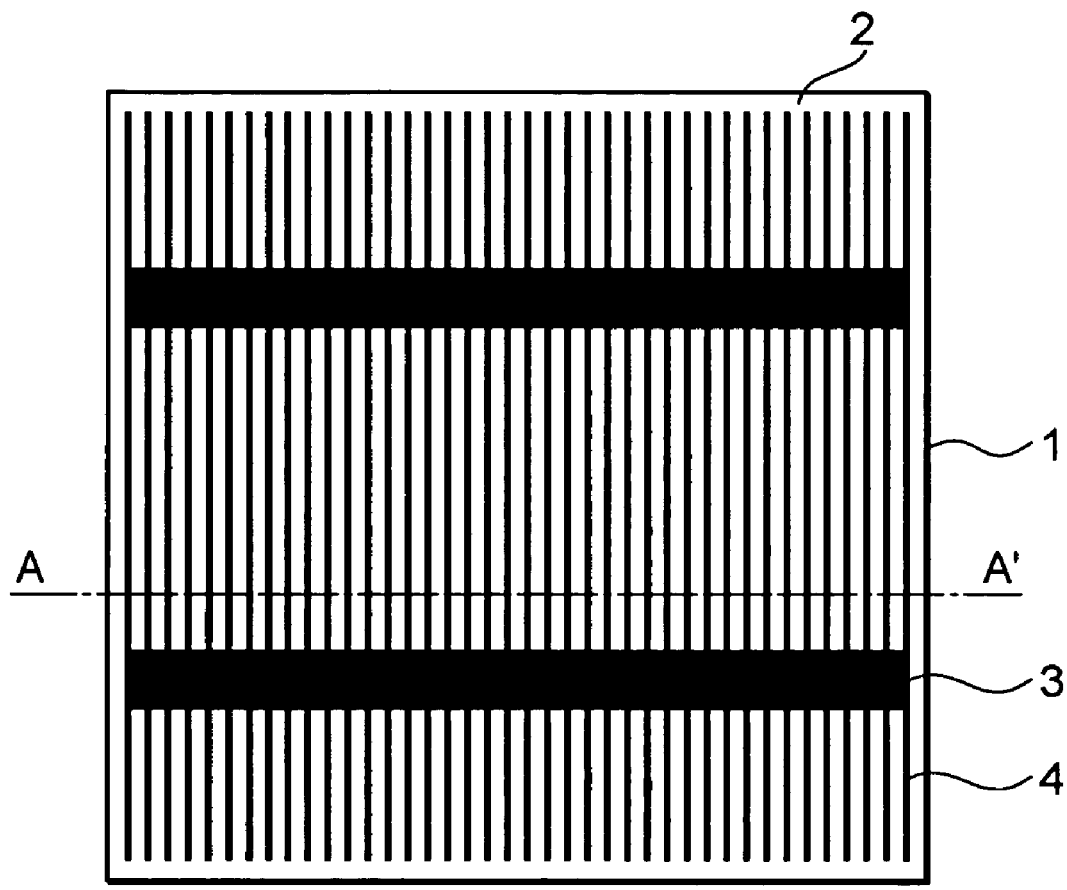
FIG. 1 is a view illustrating front-side electrode-arrangement of a silicon solar battery according to Embodiment 1 of the present invention.
Figure 2:
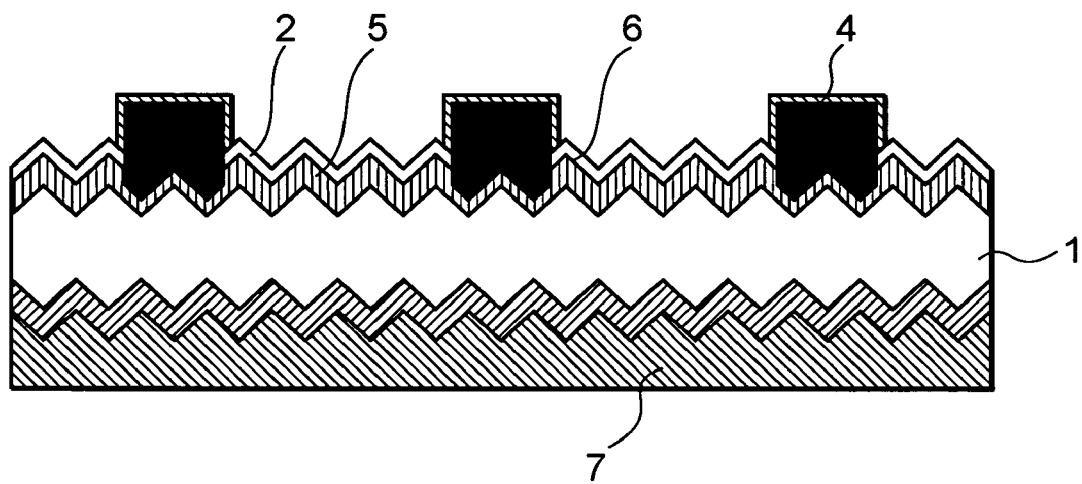
FIG. 2 is a magnified view illustrating a cross section along line A-A' represented in the view illustrating the front-side electrode-arrangement of the silicon solar battery according to Embodiment 1 of the present invention.
Figure 3:
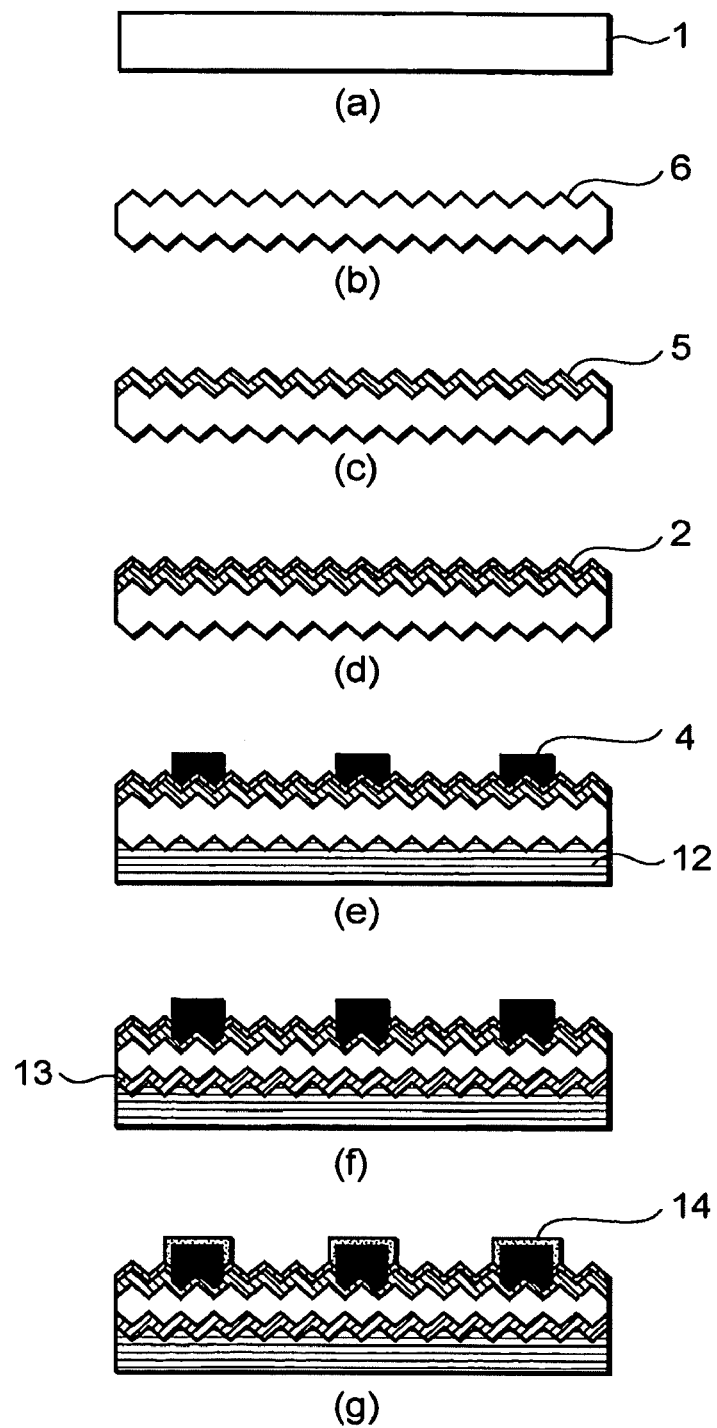
FIG. 3 is explanatory views explaining main steps of manufacturing the solar battery according to Embodiment 1 of the present invention.

Embodiment 1 according to the present invention is explained based on figures. FIG. 1 is an arrangement view illustrating front-side electrodes of a silicon solar battery according to Embodiment 1 of the present invention. FIG. 2 is a magnified view illustrating a cross section along the line A-A represented in FIG. 1. FIG. 3 is explanatory views explaining main steps of manufacturing the solar battery according to Embodiment 1 of the present invention. FIG. 4 is front views illustrating mask patterns according to Embodiment 1 of the present invention. FIG. 5 is front views illustrating other mask patterns according to Embodiment 1 of the present invention.

When the solar battery is viewed from the front side, as represented in FIG. 1, a reflection prevention film 2 is formed on a p-type silicon substrate 1 so as to prevent light reflection and receive as much sunlight as possible, and front silver grid electrodes 4 electrically connected to front silver bus electrodes 3 for outputting to the exterior of the battery electric power collected thereon are provided.

The front silver bus electrodes 3 and the front silver grid electrodes 4 play important roles to output to the exterior electric power generated inside the solar battery cells; however, on the other hand, the incident light from the sun is blocked due to the electrodes provided on the front side of the substrate, and the generation efficiency decreases; therefore, it is preferable that the area of the electrodes is made as small as possible, and accordingly, the front silver bus electrodes 3 and the front silver grid electrodes 4 are generally shaped into comb. Here, as front electrode material, in general silver would be used as a main ingredient from the viewpoint of cost and characteristics.

Next, a stacked structure of the solar battery according to the present invention is explained using FIG. 2, which is the magnified view illustrating the cross section along the line A-A' represented in FIG. 1.

In the solar battery represented in FIG. 2, on the front surface of the p-type silicon substrate 1, composed of a single crystal that has the (1, 0, 0) face orientation, whose length is approximately 150 mm, specific resistance is 0.1-5 Ω-cm, sheet resistance is 30-80Ω, and thickness is several hundred μm, an n-type layer 5 formed by diffusion, composed of the V-group elements such as phosphorus (P), and having a thickness of several hundred nm, and a texture 6 having a rough structure for confining light incident on the substrate-side are provided; then, the reflection prevention film 2 is formed thereon.

Here, each width of the front silver bus electrodes 3 is 0.5-3 mm, each width of the front silver grid electrodes 4 is 40-80 μm, and lengths of each front silver bus electrodes 3 and the front silver grid electrodes 4 are 140-150 mm. Moreover, the number of the front silver bus electrodes 3 is two or three, the number of the front silver grid electrodes 4 is 50-100, and the front silver grid electrodes 4 having a thickness of approximately 10-30 μm is used.

Moreover, upon the back face of the p-type silicon substrate 1, an aluminum electrode 7 is provided, and expecting the BSF (back surface field) effect, in order not to annihilate electrons in the p-type layer, a $p^+$-type layer 13 is provided therebetween, so as to increase the p-type-layer electron concentration in the band-structure field. Furthermore, a BSR (back surface field reflection) effect in which long-wave light passing through the p-type silicon substrate 1 is reflected and reused for generation is also expected for the aluminum electrode 7. However, because the aluminum electrode 7 frequently causes bending of the substrate and induces breakage of the substrate, the electrode may occasionally be removed after the $p^+$-type layer 13 is formed by heat processing.

Next, the main manufacturing steps for the solar battery are explained using FIG. 3. FIG. 3(a) is a cross-sectional view illustrating the p-type silicon substrate 1. FIG. 3(b) is a view illustrating a state, in which after a surface layer of approximately 10-20 μm of the substrate 1, which has been damaged when the substrate is sliced off from a cast ingot, of the silicon substrate 1, is removed for example, using from several to 20 wt % of sodium hydroxide or sodium carbonate solution, the substrate is anisotropically etched using solution that has been made by adding IPA (isopropyl alcohol) from the above solution (low-concentration alkaline solution), and then the texture 6 is formed, so that the silicon face (1, 1, 1) appears.

Next, FIG. 3(c) is a view illustrating processes in which, after an n-type layer is uniformly formed on the entire face of the p-type silicon substrate by processing of holding the substrate for several dozen minutes at a temperature of 800-900 degrees under a mixed gas atmosphere including such as phosphorus oxide trichloride ($POCl_3$), nitrogen, and oxygen, polymer resist paste is applied and dried only on the light receiving face side (upper face in the figure) by a screen printing method, and the substrate, being kept intact, is dipped, into 20 wt % of potassium hydroxide solution for several minutes so that the n-type layer having been formed on the faces other than this light receiving face is removed, and then the resist is removed by organic solvent. Thereby, the n-type layer 5 is formed only on the light receiving face side of the p-type silicon substrate 1, and such a solar battery can demonstrate, when the sheet resistance of the n-type layer uniformly formed on the front side of the p-type silicon substrate is in a range of 30-80 Ω/square, excellent electrical characteristics.

Next, FIG. 3(d) is a view illustrating a state, in which the reflection prevention film 2, such as a silicon oxide film, silicon nitride film, or titanium oxide film, is formed with a uniform thickness on the surface of the n-type layer. As a method of forming the film, for example, the silicon oxide film is deposited and formed by a plasma CVD method using $SiH_4$ gas and $NH_3$ gas as source material at a temperature of not lower than 300 degrees under decompression. Because the refractivity thereof is approximately 2.0-2.2, the most suitable thickness of the reflection prevention film is 70-90 nm. Here, it should be noted that the reflection prevention film formed as described above is an insulator; therefore, only by forming front-side electrodes on the film, the device does not work as a solar battery.

Next, FIG. 3(e) is a view illustrating a state, in which, in order to form the front silver bus electrodes 3 and the front silver grid electrodes 4, the electrodes are coated with silver paste by the screen printing method using a mask pattern, and then dried. In this case, the electrodes are formed by printing the silver paste using the screen printing method a plurality of cycles.

Here, mask patterns used for the screen printing method according to the present invention are explained using FIG. 4. FIG. 4(a) is a view illustrating a mask pattern 8 used in a first-cycle screen printing. Here, the mask pattern 8 includes a bus-electrode mask pattern 9 and a grid-electrode mask pattern 10. That is, when electrodes are formed by the screen printing method using this mask pattern, the front silver bus electrodes 3 and the front silver grid electrodes 4 are formed on the reflection prevention film 2.

Next, FIG. 4(b) is a view illustrating a mask pattern 11 used in the second-cycle screen printing. Here, in the mask pattern 11, only the grid-electrode mask pattern 10 is formed, meanwhile the bus-electrode mask pattern 9 is not provided. That is, when electrodes are formed by the screen printing method using this mask pattern, only the front silver grid electrodes 4 are formed on the reflection prevention film 2 of the p-type silicon substrate 1, and by the mask pattern 8 electrodes corresponding to the front silver grid electrodes 4 are also formed on regions of the front silver bus electrodes 3.

Successively, FIG. 3(e) is explained, in which, after the front silver bus electrodes 3 and the front silver grid electrodes 4 are formed on the front side of the p-type silicon substrate 1, aluminum paste 12 is formed on the face of the opposite side (back face).

Next, FIG. 3(f) is a view illustrating a state, in which the p-type silicon substrate 1 in which electrode paste is respectively formed on its front and back sides is sintered for several minutes at, a temperature of 600-900 degrees. Accordingly, on the front side of the substrate, silver material contacts with the silicon while the reflection prevention film melting in the presence of glassy material included in the front silver paste, and then resolidified; thereby, the electrical conduction between the front silver electrodes and the silicon is ensured. Such process is referred to as the fire-through method. Moreover, the aluminum paste 12 on the back side also reacts with the silicon, and forms the aluminum electrode 7 and a $P^+$-type layer 13 just under the electrode.

Then, FIG. 3(g) is a view illustrating a state, in which, in order to improve the moisture resistance of the silver electrodes, the solar battery is processed at a temperature of 200-250 degrees by dipping in a molten co-crystalline solder bath including lead and tin, and covered with lead solder 14 over the front silver bus electrodes 4.

By configuring as described above, the number of cycles of forming the front silver bus electrodes 3 can be reduced; as a result, the consumption of silver can be reduced, and thus, cost can be reduced as well as wasting resource can be prevented; however, because the thickness of the front silver bus electrodes 3 obviously becomes thin comparing to that of the front silver grid electrodes 4, there may be a doubt as to whether a problem with the electrode-resistance characteristics occurs. However, because electrically conductive metal is placed on the front silver bus electrodes 3 for connecting it with a cell that is referred to as a tab, due also to a synergistic effect with this conductive metal, even though the thickness of the front silver bus electrodes 3 is relatively thin, satisfactory electrode resistance can be obtained.

Moreover, when a mask pattern other than the bus-electrode mask pattern is used from the second-cycle printing, mask patterns illustrated in FIG. 5 can also be used. FIG. 5(*a*) is a view illustrating the first-cycle mask pattern, which is the same as the mask pattern 8 illustrated in FIG. 4(*a*), and includes the bus-electrode mask pattern 9 and the grid-electrode mask pattern 10. On the other hand, FIG. 5(*b*) is a view illustrating a mask pattern 15, in which both the bus-electrode mask pattern 9 and the grid-electrode mask pattern 10 are eliminated from regions corresponding to the regions of the bus-electrode mask pattern 9 of the mask pattern 8.

By configuring as described above, consumption of the silver paste can be further reduced than using the second and the subsequent printing mask patterns represented in FIG. 4; however, considering the manufacturing margin, etc., it is preferable that the overlapping region of the front silver grid electrodes and the front bus electrodes is provided as large as possible. Therefore, in a second-cycle printing mask pattern 15, by making narrower a region 16 corresponding to that of the bus-electrode mask pattern 9 of the first-cycle printing mask pattern 8 than that of the bus-electrode mask pattern 9, and making wider the grid-electrode mask pattern 10 for the corresponding width, the manufacturing margin can be taken under control.

Here, as represented in this embodiment, because a pattern corresponding to the entire predefined pattern is formed by printing once among plural-cycle printings, the reliability of the pattern associated with an unexpected accident during the manufacturing process is improved. Moreover, in particular, if the pattern is printed corresponding to the entire pattern by the first-cycle printing, in addition to the above effect, degree of freedom in designing the second and the subsequent printing patterns is increased.

Embodiment 2

Embodiment 2 according to the present invention is explained based on figures. FIG. 6 is front views illustrating mask patterns according to Embodiment 2 of the present invention. FIG. 7 is front views illustrating other mask patterns according to Embodiment 2 of the present invention.

Here, the structure and the manufacturing steps as a solar battery excluding the electrodes are the same as those in Embodiment 1, and the same numerals are attached to members that have equivalent functions to those having been explained in Embodiment 1.

FIG. 6 is views illustrating mask patterns used for manufacturing a solar battery according to the present invention. FIG. 6(*a*) is a view illustrating a first-cycle mask pattern, which is the same as the mask pattern 8 in FIG. 4(*a*) and FIG. 5(*a*) having been explained in Embodiment 1, and is composed of the bus-electrode mask pattern 9 and the grid-electrode mask pattern 10. On the other hand, FIG. 6(*b*) is a view illustrating a mask pattern 18, in which the bus-electrode mask pattern 9 is eliminated from the regions corresponding to the regions of the bus-electrode mask pattern 9 of the mask pattern 8, and only grid-electrode mask pattern 17 is provided In the grid-electrode mask pattern 17 of this mask pattern 18, each entire length of the grid portions is shorter than that of the mask pattern 8 used in the first-cycle printing operation.

Moreover, FIG. 7 is views illustrating mask patterns used for a solar battery according to the present invention. FIG. 7(*a*) is a view illustrating a first-cycle mask pattern, which is the same as the mask pattern 8 in FIG. 4(*a*) and FIG. 5(*a*) having been explained in Embodiment 1 and in FIG. 6(*a*) in this embodiment, and is composed of the bus-electrode mask pattern 9 and the grid-electrode mask pattern 10. On the other hand, FIG. 7(*b*) is a view illustrating a mask pattern 20, in which the bus-electrode mask pattern 9 is eliminated from the regions corresponding to the regions of the bus-electrode mask pattern 9 of the mask pattern 8, and only grid-electrode mask pattern 19 is provided. In the grid-electrode mask pattern 19 of this mask pattern 20, in addition to each full length of the grid portions being shorter than that of the mask pattern 8 used in the first-cycle printing operation, a grid-electrode mask pattern is not formed on the region between both the bus electrodes. Conversely, the grid-electrode mask pattern is formed only in the areas corresponding to the bus electrodes and in their peripheries.

By configuring as described above, the usage of the silver paste, used in the second and the subsequent cycle printings, for forming the front silver grid electrodes 4 can be reduced, and thus, cost can be reduced and wasting row material can be prevented. The reason why any problems with characteristics do not occur even though configuring as described above is implemented is explained as follows. It is said that the electrode resistance can generally be reduced by increasing the electrode thickness as described above. However, because of the difference of collecting current densities between the grid end portion and the connecting portion (portion connected to the bus), the thickness of the electrodes need not be uniformly thickened. Thereby, by thinning each electrode close to the end portion, where current does not concentrate, of the front silver grid electrodes 4, conversely, by thickening each electrode close to the grid connecting portion, where current concentrates, connected to the buses, it becomes possible to reduce the amount of electrode paste without decreasing the battery cell characteristics.

Cross-sectional views of substrates on which the bus electrodes and the grid electrodes are formed by printing the paste twice, according to the above two embodiments, are illustrated in FIG. 8. In this figure, (a) represents a pattern created using the mask pattern in which bus-electrode mask pattern (having been) explained in Embodiment 1 is excluded in the second and the subsequent cycle printings, meanwhile (b) represents a pattern created using the mask pattern in which, in the second and the subsequent cycle printings, bus-electrode mask pattern is excluded, but the entire length of each of the grid portions is shortened.

Regarding these (a) and (b), two kinds of cross-sectional views, which represent respectively a B-B' cross-section across the grid electrode and a C-C' cross-section across between the grid electrodes, are illustrated; specifically, are illustrated, in the bottom of this figure, the entire substrate is cut at positions represented in the partial top view of the substrate.

According to FIG. 8(*a*), on the substrate produced by the manufacturing method according to Embodiment 1 of the present invention, the electrodes are formed at the bus-electrode region corresponding to the grid electrodes, meanwhile the electrodes are not formed corresponding to the region between both the bus electrodes; therefore, it is understood that the thickness of the bus electrodes, in which the number of the printings is less, is thinner than that of the grid electrodes.

Moreover, according to FIG. 8(b), on the substrate produced by the manufacturing method according to Embodiment 2 of the present invention, the electrodes are formed at the bus-electrode region corresponding to the grid electrodes, and the length of each second-cycle grid electrode is shorter than that of each first-cycle one, meanwhile the electrodes are not formed corresponding to the region between both the bus electrodes; therefore, it is understood that the thickness of the connecting portion of each grid electrode is thinner than that of the bus-electrode side, and the thickness of the bus electrodes, in which the number of the printing operation is less, is thinner than that of the grid electrodes.

Figure 9:
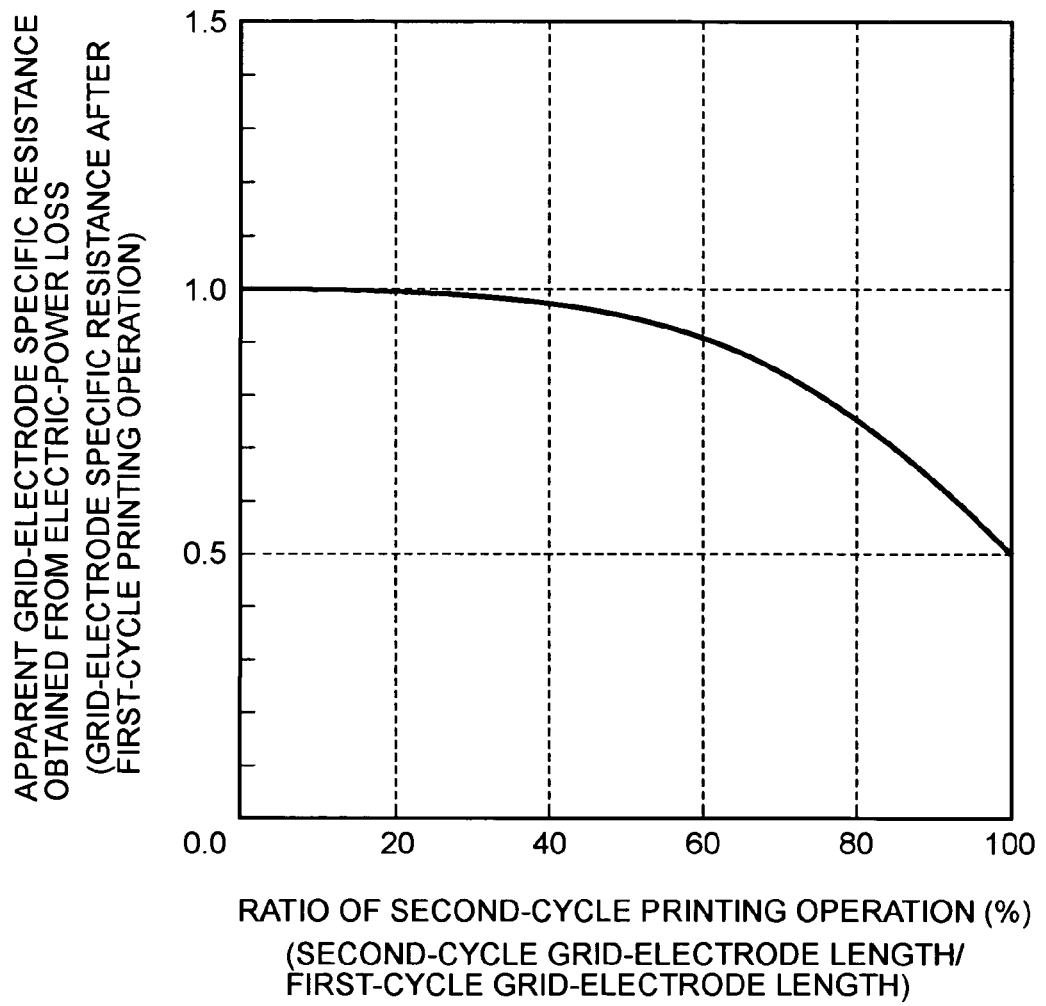
FIG. 9 is a graph representing a relationship between the ratio of grid-electrode length and the electrode specific resistance, according to Embodiment 2 of the present invention.

In a case in which the mask pattern having the shorter grid pattern is used in the second-cycle printing as described above, a result is represented in FIG. 9 in which a relationship between the ratio of grid-electrode lengths and the electrode specific resistance has been investigated. In FIG. 9, the vertical axis is the apparent grid-electrode specific resistance obtained from the electric-power loss, given that the grid-electrode specific resistance after the first-cycle printing is assumed to be 1, meanwhile the horizontal axis is the ratio of the second-cycle grid-electrode length with respect to the first-cycle grid-electrode length as a basis.

That is, the horizontal axis being 0% in this graph indicates a result equivalent to a case in which the second-cycle printing has not been performed, and the electrode specific resistance is naturally 1, meanwhile, the horizontal axis being 100% indicates a result equivalent to a case in which the second-cycle printing has been performed using a mask pattern with the same length of the grid-electrode as that in the first-cycle, and the electrode specific resistance, in this case, decreases to 0.5.

Although it is difficult to determine the most suitable value of the electrode specific resistance, the decreasing rate of the apparent grid-electrode specific resistance obtained from the electric-power loss becomes larger on reaching 60% of the horizontal axis in FIG. 9. Accordingly, it is preferable, from the viewpoint of electrical characteristic, that the second- and the subsequent cycle printing ratio is set to a value as close to 100% as possible beyond the 60% point. In this case, if the ratio is set at 100%, no effect of reducing electrode-material consumption can be obtained; however, if the ratio is set at approximately 80%, because an intermediate value of the specific resistance between the value when only one-cycle printing having been performed and the value when the horizontal axis is 100%, even though the value is in a region in which the ratio of resistance decreasing rate is larger, the characteristics can be ensured, and electrode-material consumption can also be surely reduced. Therefore, it can be concluded that, when not only focusing attention to the electrode-resistance characteristics, but also trying to reduce the electrode-material consumption, it is preferable that the ratio of the second and the subsequent cycle printings with respect to the first cycle printing is in a range of approximately 60%-80%.

However, paradoxically, if the ratio is set at not lower than 60%, because the decreasing rate of the specific resistance is too large, even though a problem with the characteristics does not occur, the quality control appears to be difficult in the manufacturing steps. From this viewpoint, even if the electrode-resistance characteristics are slightly exacerbated, a region may also be selected in which the characteristics is not likely to be influenced by the ratio of the second and the subsequent cycle printings. In this case, depending on which characteristics are set to the electrode specific resistance, the ratio of the second and the subsequent cycle printings varies; however, because it can be considered that specific-resistance stability itself is improved, it is considered enough to select the ratio at approximately 40%. As described above, it can be said that, when not only focusing attention to reducing electrode-material consumption, but also considering the electrode-resistance characteristics, it is preferable that the ratio of the second and the subsequent cycle printings with respect to the first printing is in the range of 40%-60%.

Here, according to the present invention, as a means for controlling most simply, using actual technology at this cycle, the usage of the conductive paste for the electrodes, a method is selected in which the mask pattern to be used is changed for each printing. That is, as have been explained in Embodiments 1 and 2, the bus-electrode mask pattern and the grid-electrode mask pattern are changed for the second and the subsequent cycle printings. In both these embodiments, only the mask patterns are represented as the examples so as not to form the bus electrodes when the second-cycle printing is performed; however, a method can also be applied in which a mask pattern whose grid-electrode lengths each are shortened while the bus-electrode pattern remains intact is used in the second-cycle printing. In this case, material consumption increases compared to that represented in the examples according to the present invention; however, because the consumption decreases compared to that in the conventional method, and any problems with the electrode resistance do not occur, an effect can be obtained following the present invention.

In a case in which an electrode forming means other than such mask patterns as described above is also considered, as long as only needed portions of the electrodes are thickened, meanwhile portions where, for example, current does not concentrate are thinned, technological concepts according to the present invention are considered to be included. Specifically, regarding the shapes of the bus electrodes and the grid electrodes, the idea can also be applied to a case in which a grid pattern whose width of each grid becomes narrower towards its end is used. Needless to say, grid electrodes whose shape is not straight may also be similarly used.

Moreover, even if the printing order as described above is changed, due to the principle, an effect to be obtained remains the same; thus, as long as electrode patterns are used, this idea can be widely applied. In another word, in the above embodiments having been represented as examples, on repeating printing on the surface of the substrate a predetermined number of cycles, a procedure has been adopted such that the entire predetermined pattern related to the bus and grid electrodes is printed, for example, the first cycle (FIG. 4(a), etc.); however, according to this idea of the present invention, the entire pattern does not need to be necessarily formed by the first-cycle operation. That is, for example, only the grid electrodes may be formed in the first-cycle operation using the mask pattern 11 represented in FIG. 4(b), and then, only the bus electrodes and the grid electrodes may be formed in the second-cycle operation using the mask pattern 8 represented in FIG. 4(a) or, a mask pattern may be used, as the second-cycle mask pattern, in which the length of each portion corresponding to each grid of the grid-electrode mask pattern of this second-cycle mask pattern 8 is made approximately equal to that of the grid-electrode mask pattern 17 of the mask pattern 18 in FIG. 6(*b*) (or set at 60% of the first-cycle one according to FIG. 9).

Furthermore, by printing a predetermined number of cycles using mask patterns differing from each other for each printing (that is, each of a plurality of mask patterns composes only part of the predetermined pattern, and composes the entire pattern by printing a plurality of cycles), electrodes such as bus electrodes and grid electrodes may be formed into a predetermined pattern.

The invention claimed is:

1. A solar battery comprising:
a bus electrode formed on a front face of a substrate, the bus electrode including a first bus electrode layer; and
a grid electrode formed on the front face of the substrate, the grid electrode including at least a first grid electrode layer and a second grid electrode layer;
wherein the first bus electrode layer and the first grid electrode layer have substantially the same thickness; and
wherein the second grid electrode layer is formed on the first grid electrode layer and the first bus electrode layer so that the bus electrode has thick portions and thin portions thinner than the thick portions, the thickness of the bus electrode varying in a direction parallel to a longest dimension of the bus electrode and 40-60% of the grid electrode from a connection of the grid electrode to the bus electrode, to an end portion of the grid electrode, is thicker than the end portion in a direction of a thickness of the substrate.

2. A solar battery comprising:
a bus electrode formed on a front face of a substrate, the bus electrode including a first bus electrode layer; and
a grid electrode formed on the front face of the substrate, the grid electrode including at least a first grid electrode layer and a second grid electrode layer;
wherein the first bus electrode layer and the first grid electrode layer have substantially the same thickness; and
wherein the second grid electrode layer is formed on the first grid electrode layer and the first bus electrode layer so that the bus electrode has thick portions and thin portions thinner than the thick portions, the thickness of the bus electrode varying in a direction parallel to a longest dimension of the bus electrode and 60-80% of the grid electrode from a connection of the grid electrode to the bus electrode, to an end portion of the grid electrode, is thicker than the end portion in a direction of a thickness of the substrate.

* * * * *